United States Patent [19]

Rioux

[11] Patent Number: 5,554,488
[45] Date of Patent: Sep. 10, 1996

[54] SEMICONDUCTOR DEVICE STRUCTURE AND METHOD OF FORMATION THEREOF

[75] Inventor: Brian A. Rioux, Nepean, Canada

[73] Assignee: Northern Telecom Limited, Montreal, Canada

[21] Appl. No.: 575,446

[22] Filed: Dec. 21, 1995

Related U.S. Application Data

[63] Continuation of Ser. No. 281,726, Jul. 28, 1994, abandoned.
[51] Int. Cl.$^6$ .................................................. G03F 7/00
[52] U.S. Cl. ........................... 430/315; 430/313; 430/329; 216/47
[58] Field of Search .................................. 430/313, 314, 430/315, 324, 329; 156/643.1, 654.1, 661.11; 216/13, 41, 47

[56] References Cited

U.S. PATENT DOCUMENTS

| | | | |
|---|---|---|---|
| 4,662,989 | 5/1987 | Casey | 430/315 |
| 4,814,258 | 3/1989 | Tam | 430/315 |
| 5,091,288 | 2/1992 | Zappella | 430/311 |
| 5,258,264 | 11/1993 | Mathad | 430/315 |

OTHER PUBLICATIONS

Serkawa "Lift–Off of Sputtered SiO2 Films", J. Electrochem. Soc., Apr. 1981, pp. 918–919.

*Primary Examiner*—Kathleen Duda
*Attorney, Agent, or Firm*—Angela C. de Wilton

[57] ABSTRACT

A method of forming a semiconductor structure, and a structure thereof are provided. The method is based on a novel lift-off masking process, and has particular application for forming gate structures for FETs with sputtered metals. After providing a weakly bonded surface layer on the substrate, a multilayer masking layer stack is deposited, and patterned to define an opening with undercut sidewalls. The multilayer masking stack forms a heat resistant mask for nigh temperature deposition of one or more conductive layers, e.g. sputtered metals to form a gate metal stack for a FET. The undercut sidewalls of the mask create a discontinuity in the deposited metal layers. Preferential etching of the deposited metal layers occurs at the discontinuity, resulting in separation of the gate metal structure and the excess metal overlying the masking layers. The weakly bonded surface layer on the substrate controls the adhesion of the overlying masking layers, and allows for the excess metal and the underlying masking layers to be separated from the substrate simply by a liftoff process. The latter is conveniently accomplished by application of an adhesive tape to pull up and remove the layers, separating the weakly bonded surface layer, e.g. an oxide from the substrate. The method provides for a gate structure comprising a multilayer metal stack characterized by smoothly tapered sidewalls, with substantially no undercut in which the taper angle may be controlled. Advantageously, the method avoids ion etch damage to the substrate surface surrounding the gate metal stack.

22 Claims, 3 Drawing Sheets

SEMICONDUCTOR DEVICE STRUCTURE AND METHOD OF FORMATION THEREOF

This application is a continuation of application Ser. No. 08/281,726, filed Jul. 28, 1994, now abandoned.

FIELD OF THE INVENTION

This invention relates to a semiconductor device structure, and a method of formation thereof, with particular application to a self-aligned gate structure for a field effect transistor.

BACKGROUND OF THE INVENTION

In a known structure of a self-aligned-gate depletion mode field effect transistor (SAG-DFET) formed on a compound semiconductor substrate, (e.g. a GaAs wafer), a multilayer metal gate structure is provided. The gate structure comprises, for example, a lower layer of a refractory metal silicide, e.g. tungsten silicide, to form a Schottky gate contact with the substrate, and an upper layer of refractory metal, i.e. tungsten to reduce the gate resistance. The multilayer gate structure is typically formed by blanket deposition of layers of tungsten and tungsten silicide overall, and then selectively removing the tungsten/tungsten silicide layers from the semiconductor substrate to leave a gate structure.

For example, a conventional known gate formation process comprises the following steps:
chemical preclean of the substrate surface;
sputter deposition of the Schottky gate metal stack e.g. tungsten silicide and tungsten;
deposition of a photoresist bilayer and patterning to define openings for a gate etch mask
formation of a metallic gate etch mask, e.g. Al, by evaporation,
photoresist strip;
etching of the gate metal stack by high energy plasma etching;
removal of the metal gate etch mask from the gate structure.

However, it was found that some FETs with etched gates suffered from highly variable breakdown voltages and insufficient current carrying capability.

These effects are associated with a number of problems commonly encountered during this process sequence, particularly relating to the etch process. These problems include gate undercut due to overetching, because the underlying tungsten silicide may etch preferentially to the tungsten layer. An LDD (lightly doped drain) region under the resulting tungsten overhang cannot be sufficiently implanted (i.e. doped) to maintain low channel resistance. Also, subsequent interconnect step coverage is poor when the gate sidewalls are undercut.

On the other hand, underetching may leave metal residues of tungsten and tungsten silicide on the substrate surface. These residues lead to low breakdown voltages. Furthermore, the etch process may leave rough gate edges, which leads to variability in the breakdown voltage. Wide gates have lower breakdown voltages than narrow gates, due to a larger number of edge defects present.

Moreover, the substrate surface suffers ion bombardment during the gate etch. Since the metal layers of the gate stack are blanket deposited overall, the total thickness of the excess metal layers around the gate structures must be removed from the substrate surface around the gate structure. The required high energy plasma etch causes surface damage in the active region surrounding the gate. This surface damage may cause dopant neutralization and lead to current pinch off, and gain variations.

Interactions between these effects lead to devices with unpredictable behavior and poor reliability.

On the other hand, alternative gate etch processes are limited by the available etch chemistries suitable for selectively etching tungsten and tungsten silicide on compound semiconductor substrates.

Refractory metals, e.g. tungsten and titanium are preferred for this application because they are chemically stable and withstand heat cycling at elevated temperatures in subsequent process steps, e.g. annealing to activate dopant in the source/drain regions. Tungsten/tungsten silicide is an existing and proven gate metallurgy for FETs on compound semiconductor substrates.

Typically, a high energy plasma etch, e.g. a $CF_4/_2$ etch gas mixture at a high bias, ~400 eV is a preferred etch for a tungsten/tungsten silicide gate metal snack. Although this etch results in some undercut, the etch uniformity across wafers is typically better than that obtained with alternatives, e.g. an $SF_6/O_2$ plasma etch.

Sputtered metal films are preferred over evaporated metal films because evaporated metal films suffer from high tensile stress. Compound semiconductors such as GaAs are piezoelectric and thus are particularly susceptible to stress related doping effects when high stress evaporated metal films are deposited on the semiconductor surface. Sputtering provides a more convenient deposition process, in which the stress in the deposited film can be better controlled during deposition, e.g. by controlling the deposition pressure.

An alternative approach to gate fabrication which has been used with evaporated metals is known as a polymer lift-off process. For example a process is described in U.S. Pat. No. 4,814,258 to Tam, entitled "A PMGI bi-layer lift-off process" in which a polymer bi-layer is used as a mask. After evaporation of the metal, which has a low step coverage, the polymer mask is separated from the substrate, e.g. by a solvent soak, and then lifted off leaving the evaporated metal film in selected areas on the substrate. However, known polymers used for conventional lift-off masks cannot with stand the higher temperatures, i.e. ≧300° C. as required for deposition of sputtered metals. Not only is there a problem with the polymers softening or melting, and therefore losing dimensional stability, there is also a risk of contamination of the substrate by polymer residues. Thus known lift-off polymer processes are unsuitable for higher temperature deposition of refractory metals by sputtering or chemical vapour deposition (CVD).

SUMMARY OF THE INVENTION

Thus, the present invention seeks to provide an alternative method of forming a semiconductor device structure, a method of forming a self-aligned gate structure for a FET, and structures thereof, which avoid or reduce the above mentioned problems.

Thus according to one aspect of the present invention there is provided a method of forming semiconductor device comprising:
providing a semiconductor substrate having a planar surface;
preparing the surface by providing a surface layer of a material which is weakly bonded to the surface;

providing thereon a multilayer masking stack comprising a first masking layer of a material which may be etched selectively relatively to the substrate, and a second layer which has differential etch selectivity relative to the first masking layer;

patterning and etching the multilayer masking stack to define an opening for formation of a device structure on the substrate surface, the differential etch selectivity of the first and second masking layers providing for controlled undercutting of first masking layer relative to the second masking layer, to provide a device opening with undercut sidewalls, and exposing the underlying substrate within the opening;

depositing overall at least one layer of conductive material to form a contact with the substrate within the device opening, said at least one layer of conductive material thereby being deposited on the substrate surface within the device opening and over the surface of the multilayer masking stack, and the undercut sidewalls of the device opening causing a discontinuity in the at least one layer of conductive material, near the sidewall;

etching the at least one layer of conductive material, whereby etching occurs preferentially at the discontinuity near the sidewall and separates part of the at least one layer of conductive material to form a device structure on the substrate surface, thereby separating said part from surrounding parts of the at least one layer of conductive material and the underlying masking layers;

and then, removing the masking layer stack with the overlying conductive material by a lift-off process in which said layers are separated from the substrate at the weakly bonded surface layer.

Thus method is based on a lift-off masking step which avoids blanket deposition of gate metal which would require etching of metal from the substrate. The method makes use of controlled adhesion of a multilayer masking stack on the substrate to provide for a novel application of a lift-off process to form semiconductor device structures. Preferably the masking layer stack comprises non-polymeric, heat resistant materials, other than conventional lift-off polymers, so that the device structure may be formed using metal deposition at elevated temperatures. Thus the method may be used for device structures formed with sputtered or CVD metals, e.g. using a masking layer stack comprising silicon and silicon dioxide or other materials described below.

According to another aspect of the present invention there is provided a method of forming a self-aligned-gate structure of a FET, comprising providing a semiconductor substrate having a planar surface;

preparing the substrate by providing a surface layer of a material which is weakly bonded to the substrate;

providing thereon a multilayer masking stack comprising a first masking layer of a material which may be etched selectively relatively to the substrate, and a second layer which has differential etch selectivity relative to the to the first masking layer;

patterning and etching the multilayer masking stack to define opening for a gate structure on the substrate surface, the differential etch selectivity of the first and second masking layers providing for controlled undercutting of first layer relative to the second layer to provide a gate opening with undercut sidewalls exposing the underlying substrate within the opening;

depositing overall at least one layer of a conductive material to form a contact with the substrate within the gate opening, the at least one layer of conductive material thereby being deposited on the substrate surface within the gate opening and over the surface of the composite mask stack, and the undercut sidewalls of the gate opening causing a discontinuity in the deposited metal layers near the sidewall;

etching the at least one conductive layer, whereby etching occurs preferentially at the discontinuity, separating part of the conductive layers forming a gate structure from surrounding parts of the at least one conductive layer and the underlying masking layers;

and then, removing the composite masking layer with the overlying conductive layers by a lift-off process, in which said layers are separated from the substrate at the weakly bonded surface layer.

After providing a weakly bonded surface layer on the substrate, the multilayer masking layer stack is deposited, and patterned to define a opening with undercut sidewalls. The multilayer masking layer forms a deposition mask during high temperature deposition of one or more conductive layers, e.g. to form a gate metal stack. The undercut sidewalls of the mask create a discontinuity in the deposited metal layers. Preferential etching of the deposited metal layers occurs at the discontinuity, resulting in separation of the gate metal structure and the excess metal overlying the masking layers. The weakly bonded surface layer on the substrate controls the adhesion of the overlying masking layers, and allows for the excess metal and the underlying masking layers to be separated from the substrate by a lift-off process. The latter is conveniently accomplished by application of an adhesive tape to pull up and remove the excess metal and the masking layers, thereby separating the weakly bonded surface layer, i.e. an oxide from the substrate. Differential etch selectivities of masking layers and the gate metal stack provide for formation of a device structure comprising a multilayer metal stack having smoothly tapered sidewalls, without undercutting and in which the taper angle may be controlled. Advantageously the method avoids ion etch damage to the substrate surface surrounding the gate metal stack.

Beneficially the masking stack comprises non polymeric, heat resistant materials to allow gate metal deposition at elevated temperature by sputtering or CVD.

A gate structure may be provided from one or more conductive layers, for example a typical gate structure comprises a refractory metal silicide and an overlying refractory metal. The differential etch characteristics of the planar metal layers on the surface and the metal at the discontinuity allow for etching to separate parts of the metal layers forming the gate structure, gate structure from the surrounding surface layers of metal. Advantageously, the separation etch chemistry allows for preferential etching of part of the masking layer relative to the tungsten/tungsten silicide which thereby shape the sidewalls of the gate structure to form a taper. The relative thickness of the masking layer stack and the deposited metal stack may be used to control the taper angle of the sidewall.

The weakly bonded layer on the substrate surface controls the adhesion between the masking layer and the substrate. Thus the masking layers and overlying metal stack may be removed by a lift-off technique, which physically separates the metal and underlying masking layers from the substrate surface. When a weakly bonded surface layer, e.g. an oxide, the masking layers may be removed by attaching an adhesive tape to the parts of the surface metal layers surrounding the gate regions, the tape provides means for lifting off, i.e. peeling or separating, the excess gate stack metal together with the underlying masking layer from the surface, leaving the tapered gate metal stacks extending from the surface. Any remaining substrate surface oxide which is not removed in the lift off process is readily removed from the substrate surface by a mild etch (i.e. HF dip).

Thus exposure of the substrate surface to damage by ion bombardment during metal etching of a blanket metal layer from the substrate is avoided.

When the substrate is a compound semiconductor such as GaAs, and the metal gate stack comprises a refractory metal and a corresponding refractory metal silicide, suitable materials for the masking layers include a first masking layer of silicon dioxide and a second masking layer of silicon. Adhesion between the $SiO_2$ and the GaAs substrate is controlled by the surface oxide layer formed on the GaAs surface initially before depositing the $SiO_2$ and Si masking layers. The differential etch selectivity of the first and second masking layers provides for undercutting of the gate opening to control the metal sputter deposition step. The discontinuity created in the sputter deposited metal then controls the gate separation etch required before the lift off process.

Thus the poor adhesion of surface oxides to GaAs, which has traditionally been a problem, is used to advantage in this process. Adhesion of the overlying layers is controlled by the loosely bonded arsenic oxide layer Lift off is preferably achieved simply by applying a film, i.e. in the form of an adhesive tape, to the wafer surface which adheres to the excess metal surrounding the gate structures, and allows the excess metal and masking layers to be peeled off with the tape.

According to further aspect of the present invention there is provided a semiconductor device structure formed on a semiconductor substrate comprising:

a device structure comprising a multilayer stack of conductive materials extending from the surface of a semiconductor substrate, the gate stack being characterized by smooth tapered sidewalls substantially without undercut.

According to yet another aspect of the present invention there is provides a self-aligned gate structure for a FET formed on a compound semiconductor substrate comprising:

a multilayer gate stack extending from the surface of a semiconductor substrate, the multilayer gate stack being characterized by smooth tapered sidewalls substantially without undercut.

Preferably, the gate metal stack comprises a first layer of a refractory metal silicide and an overlying layer of the corresponding refractory metal, wherein the refractory metal is tungsten. Thus beneficially the gate structure may be provided by a proven gate metallurgy such as tungsten silicide and tungsten while avoiding undercut and other problems of known methods. Alternatively the stack may comprise other refractory metal materials, e.g. layers of Ti or Mo and their silicides.

Advantageously, the tapered sidewalls have a taper angle which can be controlled by the relative thickness of the masking layer stack and deposited conductive layers during deposition. A sidewall taper of approximately 75° allows for good step coverage by overlying layers in subsequent process steps.

Thus the present invention provides a method of forming a semiconductor device structure, a method of forming a self aligned gate structure for a FET, and structure thereof, which avoid or reduce the above mentioned problems.

BRIEF DESCRIPTION OF THE DRAWINGS

Embodiments of the invention will now be described by way of example, with reference to the accompanying drawing, in which.

DESCRIPTION OF THE PREFERRED EMBODIMENTS

Figure 1:
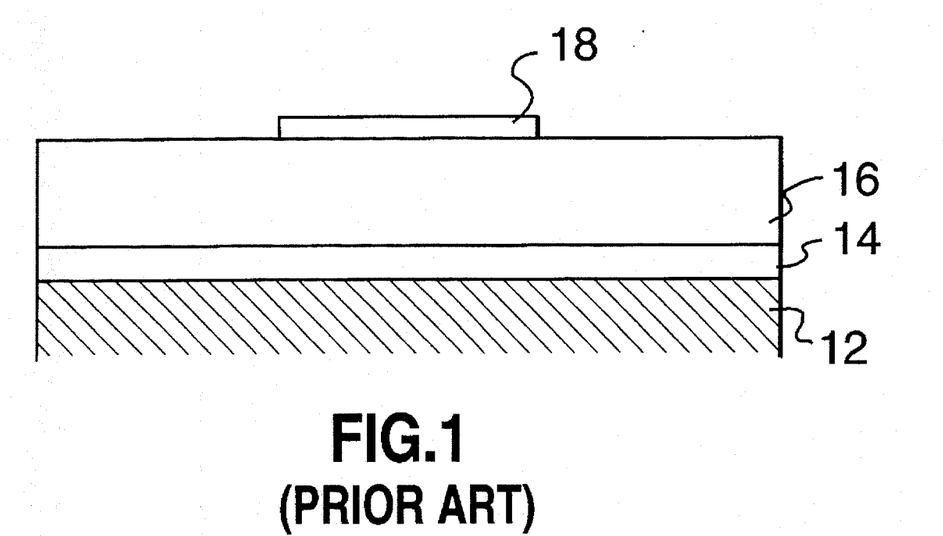
FIG. 1 and 2 shows steps in a known prior art method of forming a gate structure of a SAG-DFET.
Figure 2:
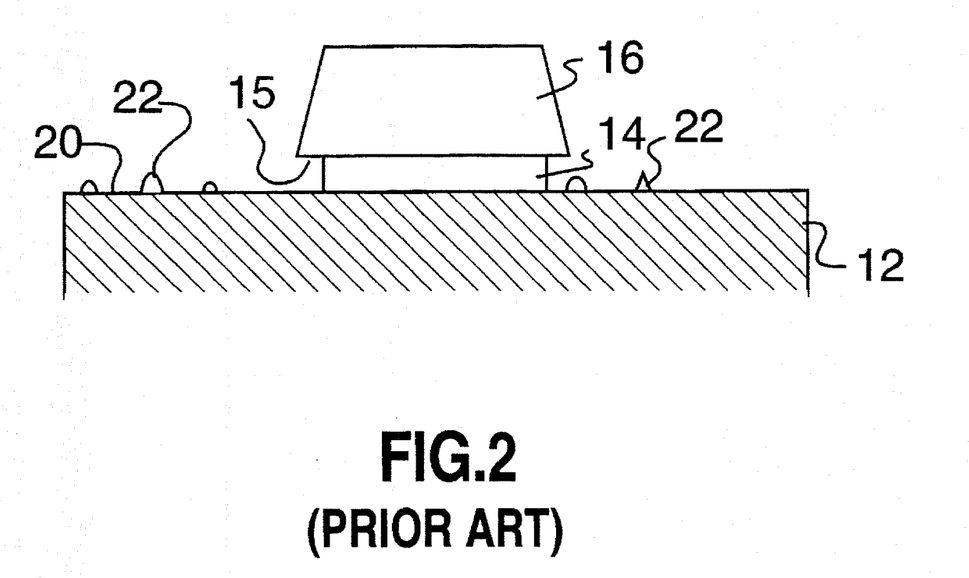

A method of forming an integrated circuit structure comprising a metal gate stack for a SAG-DFET according to a known conventional prior art method is shown schematically in FIGS. 1 and 2. A blanket layer of tungsten silicide 14 and an overlying layer of tungsten 16 are deposited on a compound semiconductor (e.g. GaAs) substrate wafer 12. The metal stack is selectively masked with a metal gate etching mask 18, i.e. a layer of evaporated aluminum (FIG. 1). The structure is then subjected to a high energy plasma etch to remove the gate metal stack comprising layers 14 and 16, from the substrate surface 20 leaving the gate structure under the gate etch mask 18. The gate etch mask 18 is then removed. After etching, the resulting gate structure is as shown schematically in FIG. 2. The sidewalls of the tungsten layer 16 may be tapered slightly, but the tungsten silicide layer 14 tends to be undercut at region 15 under the edges of the tungsten layer 16. The substrate surface 20 surrounding the gate structure is exposed to the metal etch and may sustain ion damage. Also, tungsten and tungsten silicide residues 22 may be left on the substrate surface 20.

Figure 3:
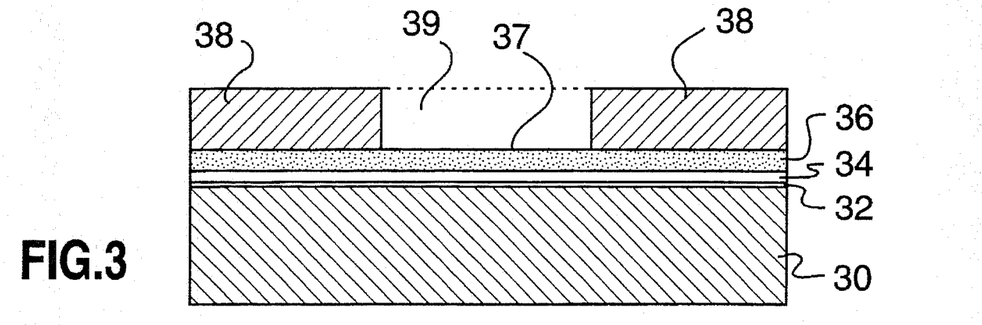
FIGS. 3 to 10 shows successive process steps in a method of forming a self-aligned gate structure of a FET according to an embodiment of the present invention.

In a method of forming an semiconductor device structure comprising a SAG-DFET according to a first embodiment of the present invention, a compound semiconductor substrate is provided, i.e. a conventional GaAs substrate wafer 30 (FIG. 3). The surface of the substrate is pre-cleaned in a conventional manner and then exposed to a short plasma oxidation treatment to oxidize the GaAs substrate surface and form a thin, surface oxide layer 32, which comprises arsenic oxide. The latter forms a weakly bonded surface layer. A multilayer masking stack is then provided overall by chemical vapour deposition, comprising a first masking layer 34 of silicon dioxide, and a second masking layer 36 of silicon. The weakly bonded surface oxide layer 32 functions as an adhesion layer, which controls the adhesion of the masking layer stack comprising layers 34 and 36, on the substrate, as will be described below.

Figure 4:
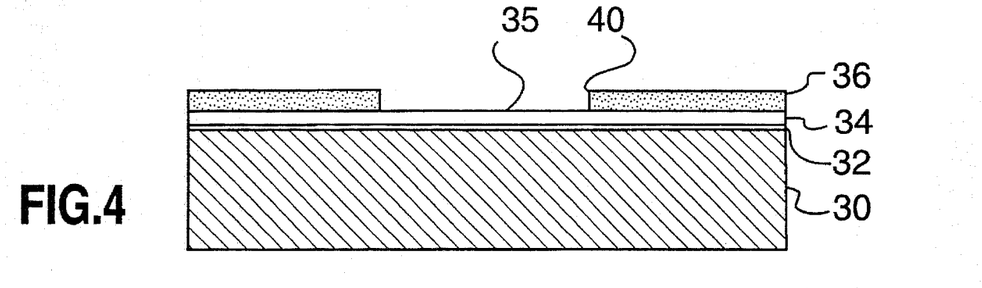
Figure 5:
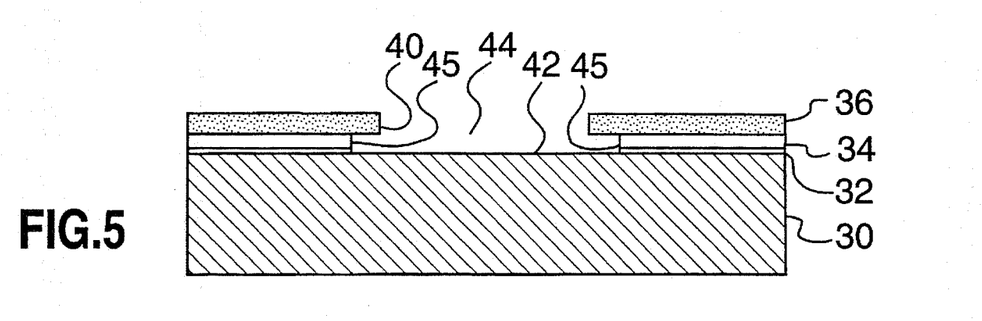

The multilayer masking stack is coated with a layer of photoresist 38 which is patterned to define gate openings 39 in the resist layer where DFET gate structures are required on the substrate surface. The exposed region 37 of layer 36 of silicon within the opening 39 in the resist is selectively and anisotropically dry etched relative to the underlying silicon dioxide layer 34, to leave an opening 40 in the silicon layer 36 exposing the surface 35 of the underlying silicon dioxide layer 34 over the gate regions. FIG. 4 shows the resulting structure after the photoresist is stripped. The sample is then etched to remove the exposed part of silicon dioxide layer 34 from the substrate within the opening 40, for example, by an aqueous HF etch. The exposed part of the weakly bonded surface layer of arsenic oxide 32 is also removed from the substrate surface. The substrate surface 42 is thus exposed within the gate opening 44 in the multilayer masking stack. When the aqueous HF etch removes the layer of silicon dioxide, because the etch is isotropic, the silicon dioxide layer 34 is undercut under edge of the silicon layer 36 in region 45. Thus the resulting mask opening 44 in the silicon/silicon dioxide masking layer stack has an undercut sidewall structure as shown in FIG. 5.

Figure 6:
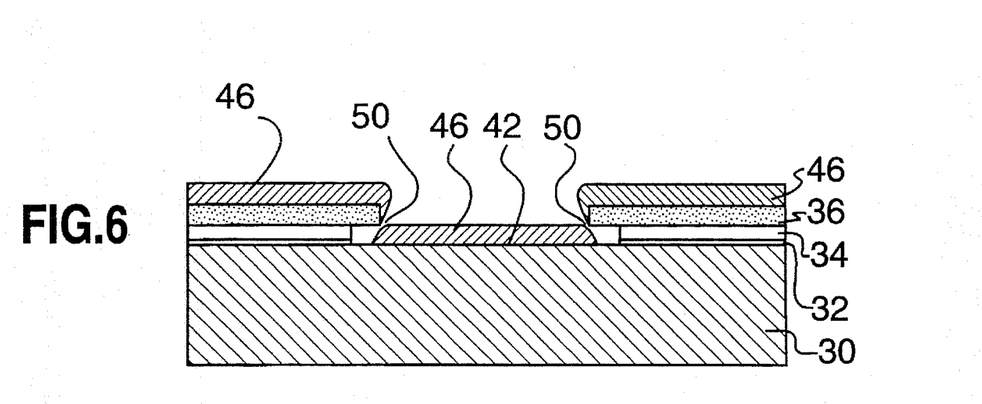
Figure 7:
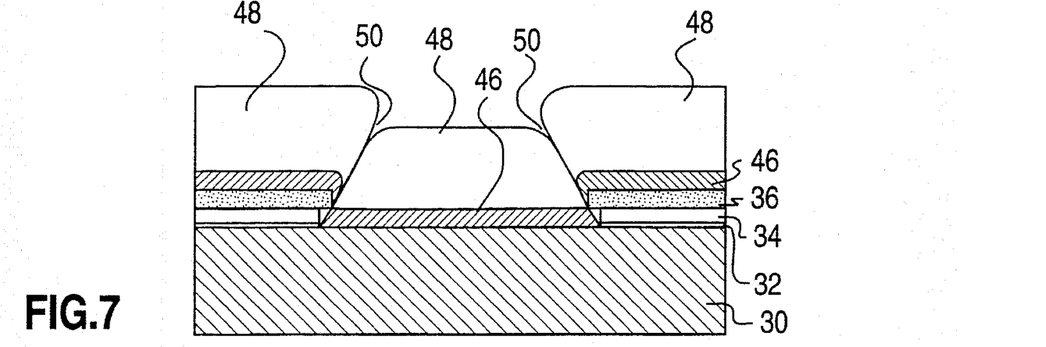

A first conductive layer of tungsten silicide 46 is then deposited overall by sputtering, and thus forms a Schottky gate contact with the substrate surface 42 in the gate opening 44 (FIG. 6). The sputtered layer has low step coverage, and thus the undercut structure of the sidewall at 45 results in a discontinuity 50 in the deposited silicide layer over the sidewall. A second conductive layer 48 comprising tungsten is then deposited over the tungsten silicide layer 46 (FIG. 7). The discontinuity 50 over the sidewall propagates into the tungsten layer 48.

Thus the resulting gate metal stack comprises two sputtered layers: a sputtered layer of tungsten silicide 46 and a layer of sputtered tungsten 48 (FIG. 7). The undercut sidewall structure of the "stencil" like mask comprising layers 32 and 34 functions to create the discontinuity 50 in the sputtered conductive layers, as shown in FIG. 6 and 7. The undercut edge 45 is instrumental in creating the discontinuity 50 extending outwards, at an angle, from the undercut sidewall as shown in FIG. 7.

Subsequently, the structure is exposed to a low energy plasma etch, which disconnects part of the metal stack 48A forming the gate structure from the excess sputtered metal stack 48B on the surrounding substrate. Separation of parts 48A and 48B occurs because the discontinuity 50 is etched preferentially in a separation etch process. That is, the metal at the discontinuity etches back more quickly than the surface metal, so that the gate structure is separated from the surrounding region more quickly than the overall metal layer is thinned to provide the structure as shown in FIG. 8.

As an example, a sample in which the length of the discontinuity was 8500 Å required 80 seconds to be etched open to separate the gate structure, using a low energy (30 eV) $CF_4/O_2$ plasma etch process. At the same time 1100 Å of tungsten is removed from the top of the metal stack. Consequently the discontinuity 50 in the metal stack over the sidewall etched 8 times faster than a planar surface layer of tungsten.

Preferential attack of stressed or cracked metals is well known and has often plagued conventional semiconductor processing. Here the effect has purposefully been used to advantage in patterning the metal layers. A low energy ion etch which is effective in etching the discontinuity, avoids ion damage to the substrate. The low energy $CF_4/O_2$ plasma etch process is gentle and nearly isotropic. However, during the gate metal etch, the gates do not undercut because the exposed silicon layer, i.e. the second masking layer, is much more easily consumed in the separation etching plasma than the gate metal stack, and locally slows the etch rates of tungsten and tungsten silicide, to protect the silicide from undercut.

Figure 8:
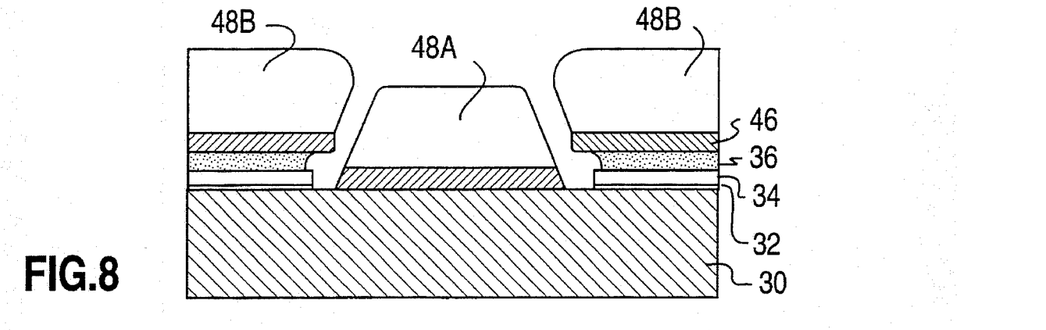
Figure 9:
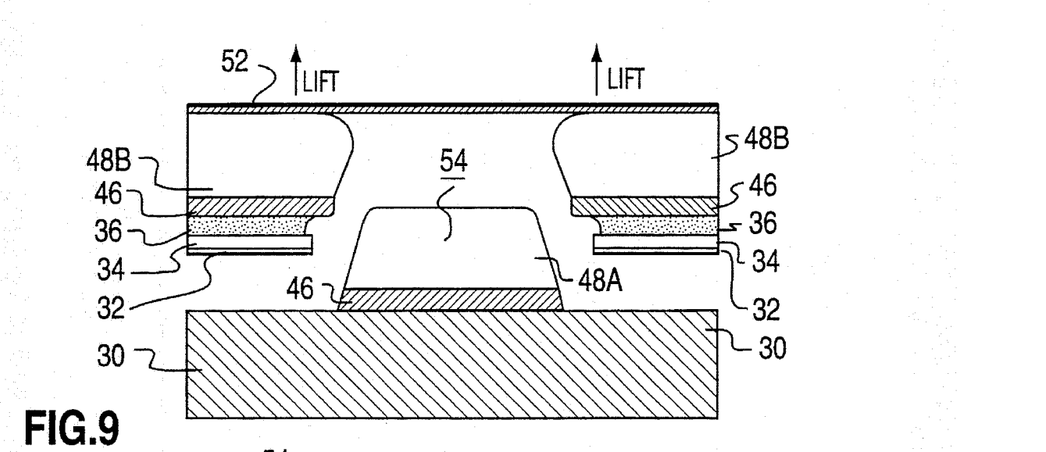

After separation of the gate structure as shown in FIG. 8, an adhesive layer, e.g. an adhesive tape 52, is attached to the wafer surface to provide a means for lifting-off the excess metal layer 48B (FIG. 9). Since the metal stack forming the gate structure is recessed relative to the excess metal 48B on the masking layer stack, the adhesive tape sticks only to the excess metal 48B. The weakly bonded arsenic oxide layer 32 controls the adhesion between the silicon dioxide layer 34 and GaAs substrate 30. The bonding of the oxide layer 32 is sufficiently weak that the overlying layers, including the excess metal layers 46 and 47, are readily separated by a lift-off technique simply by using the adhesive tape to pull up the masking layers 34 and 36, and overlying metal layers 46 and 48. These layers are thereby peeled off with the adhesive tape, separation occurs at the weakly bonded layer of oxide 32.

After lift off, any residual surface oxide 32 may be removed in a mild etch, e.g. an aqueous HF dip.

Figure 10:
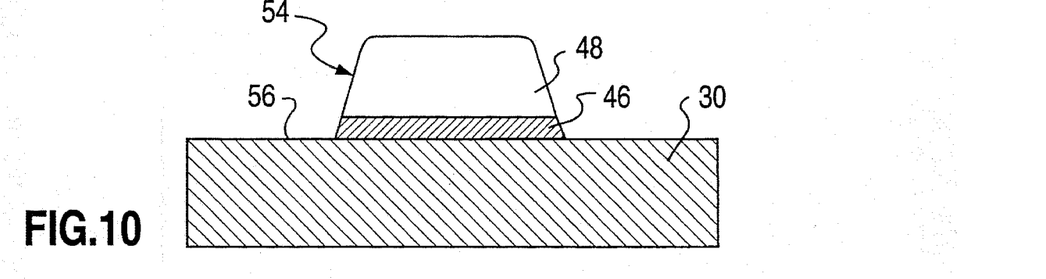

The resulting gate structure 54, as shown in FIG. 10, is characterized by a metal stack having smooth tapered, sloping sidewalls extending from the surrounding planar substrate surface 56. In this example, the sidewalls are angled at approximately 75°, allowing for excellent step coverage of subsequent layers.

In the separation etch step, e.g. using a $CF_4/O_2$ reactive gas mixture, a low energy plasma etch provides a gentle, almost isotropic etch process which tends to etch the gate stack in a lateral direction as well as remove material from the top surface of the gate metal stack. In fact, this may be beneficial, in that a gate opening in the mask may be defined by photo-lithography with a relatively large dimension, and then the lateral component of the etch process results in a smaller dimension gate. For example, in one process, a 1.2 μm lithographic opening for the gate produced a gate width of 0.9 μm. The method has been shown to be applicable to gate widths at least as small as 0.25 μm.

Several factors influence the taper angle. The taper angle of the gate structure is controlled in part by the relative thicknesses of the masking layer stack and the deposited layers forming the gate structure. The thickness of the masking layer stack controls the relative thickness of the sputtered metal deposited in the opening and on the surface of the masking layer, and the angle of the discontinuity relative to the sidewall. A masking layer stack which is thick relative to the gate metal stack will result in a strongly tapered gate sidewall. A thin masking layer stack and a relatively thick gate metal stack will create near vertical sidewalls. Since the second masking layer is provided by a material which is preferentially etched, the separation etch consumes the second masking layer, i.e. silicon controlling the form of the top layer of the gate metal stack. The first conductive layer i.e. the silicide, at the foot of the gate structure is protected. As the etch proceeds and the silicon masking layer recedes, the surface top layer of the gate metal stack is etched. However, the gate structure becomes more separated from the masking layers by preferential etching of the metal gate stack at the discontinuity 50. As the silicon masking layer recedes further, the etch begins to remove more of the gate metal stack towards the foot of the gate structure. The etch rate of the gate metal stack in a lateral direction increases, when the silicon layer of the masking layer stack is consumed, and the sidewall of the gate metal becomes more vertical as the etch proceeds.

The DFET is completed by conventional known process steps, e.g. completion of self-aligned source and drain implants, and formation of conductive contacts to gate, source and drain. Advantageously, this process avoids metal residues on the substrate surface, and avoids gate undercut. Furthermore the gate sidewall taper can be controlled. Breakdown voltage of these FETs was found to be independent of gate size.

Also, because a low energy plasma etch is sufficient to accomplish the gate separation etch, exposure of the substrate surface around the gate structure to damage from high energy ion bombardment is significantly reduced relative to known processes. The latter is particularly beneficial in avoiding damage to the active device region of the substrate surrounding the gate structure.

While the method is generally applicable to formation of gate structures of materials other than tungsten and tungsten silicide, and on other compound semiconductor substrates, the success of the above described lift off process does depend on selecting a suitable combination of materials for each step.

The masking layer stack will typically comprise two layers of materials which have differential etch characteristics. Any suitable combination of dry etch, wet etch or a combination of wet and dry etch processes may be used to provide the undercut sidewall structure in the gate opening of the masking layer stack.

The masking layers must be capable of withstanding the temperatures required for deposition of the gate metal stack at elevated temperatures. The gate metal stack may comprise sputtered metal films, e.g. at temperatures of 300° C. Thus a typical known polymer type lift-off masking layer would not be suitable, because it may soften, melt or decompose, and cause contamination at the temperatures typically required for sputtered or CVD metal deposition.

The first and second masking layers are chosen to have complementary properties and process characteristics, including differential etch selectivity. For example, in the embodiment described above, silicon is chosen as the upper layer because it is easily plasma etched and withstands exposure to HF cleaning during removal of the underlying silicon dioxide, without dimensional change. Silicon dioxide is chosen as the underlying layer because it has a relatively low etch rate during the silicon etch, but the exposed silicon dioxide layer is easily removed in HF to allow for removal of the silicon oxide from the substrate surface 42 in the gate opening 44, to leave an undercut in region 45. Other pairs of materials which have been tested for non-polymeric bilayer masking stacks, on GaAs type substrates, include aluminum on titanium; aluminum on silicon dioxide; and aluminum on silicon nitride.

Furthermore, for the lift-off process to work successfully, it is necessary to be able to provide a weakly bonded surface layer on the semiconductor substrate surface, e.g. an oxide on a GaAs surface, or an equivalent weakly bonded surface layer, which had sufficient adhesion to hold the masking layers in place during sputtering, but then allows subsequently deposited layer to be physically separated and stripped off the substrate by the lift-off process.

Surface irregularities were found to allow excess film to break off, and tended to leave behind debris. Consequently, the method is beneficially used with a substrate having a substantially planar surface.

Silicon and silicon dioxide provide well known materials having the required characteristics for use as a masking layer with a compound semiconductor surface, e.g. GaAs, GaAlAs, InGaAs, InP, and others. The latter form a poorly bonded oxide, or equivalent weakly bonded surface layer, to facilitate lift-off and which is easily removable in a chemical clean/strip.

Other combinations of masking materials having suitable process characteristics may be used alternatively, and may be preferred for use on other semiconductor substrate materials. Clearly, for example, silicon oxide would not provide a suitable surface oxide layer for application of the lift-off process on a silicon substrate, because silicon dioxide is a strongly bonded oxide. However, for example a thin layer of germanium may be deposited on a silicon surface and then oxidized to form a weakly bonded germanium oxide layer, before depositing the multilayer masking stack.

Other pairs of materials which have been tested for non polymeric bilayer masking stacks, on GaAs type substrates, include aluminum on titanium; aluminum on silicon dioxide; and aluminum on silicon nitride.

The method described above using a bilayer masking stack of heat resistant, non-polymeric masking materials may provides an advantage for other methods of deposition of metals and conductive materials at elevated temperatures, e.g. chemical vapour deposition, e.g. CVD tungsten at >300° C. where a conventional lift-off polymer mask would be unsuitable.

As described above, a two layer gate metal stack is; provided by sputter deposition. In alternative embodiments not shown, the gate structure comprises a single layer of a suitable conductive material for example tungsten silicide.

A method according to the embodiment may also be adapted to form other semiconductor device structures, e.g. diodes, structures for optoelectronic devices including lasers, light blocks, and reflectors. This method is also considered to be applicable to fabrication of parts for micromachines.

In considering other refractory metals and refractory metal silicides for use as gate metals the etch characteristics of the materials relative to the masking layers must be considered. E.g. Ti may be used as a masking layer. It was found that titanium, like $SiO_2$, etched rapidly in HF. Consequently, the sidewall taper of a Ti the gate structure could not be controlled as described above by using etch selectivity between the masking layers and the gate metal stack. Other refractory metals and silicides may be used, as gate metals e.g. molybdenum.

In modifications of the embodiments, any suitable combination of wet etching, dry etching, or wet and dry etching steps may be used for etching the masking layer stack to define an opening with undercut sidewalls.

A non-polymeric masking layer stack, e.g. silicon dioxide and silicon or other materials as described above, is particularly suitable for use with higher temperature depositions, e.g. sputtering or chemical vapour deposition (CVD) at temperatures of several hundred degrees Celsius, at which known organic polymer lift-off films would be unstable. The method would also be advantageous for low temperature deposition where use of a polymer layer would be undesirable or incompatible for some other reason.

In a method according to another embodiment of the invention not shown, a single layer masking layer may be used to define the gate openings using an anisotropic etch process to form a steep sided opening. Then an isotropic etch is provided to remove a surface layer of the substrate and undercut the mask layer to provide an undercut sidewall. Subsequently the channel region is doped, e.g. by implantation and anneal following the etch. The gate metal is then deposited in the gate opening. However, this alternative embodiment suffers the disadvantage that the differential etch characteristics of 2 or more masking layers cannot be used to control the gate separation etch in the manner described in the preferred (first) embodiment to control the taper angle of the gate structure.

A mechanical lift off process, i.e. using an adhesive tape, is convenient for a structure such as an array of gate structures on an integrated circuit as described in the embodiments. Alternatively, the masking layers and overlying metal layers may be separated from the substrate by a wet etch, which chemically removes the weakly bonded surface layer and undercuts the masking layers to detach the masking layers with the overlying metal layers. The latter is particularly advantageous when the method is applied to small dimensional structures e.g. an array of minimum dimension, closely spaced, interdigitated fingers. When the sample is dipped in a suitable etchant bath, e.g. aqueous HF, when the etchant reacts, the small dimension regions of the masking layers are quickly undercut, and foam and bubbles are created as the surface layer e.g. an oxide, is dissolved and tends to aid lift-off of the masking layers.

What is claimed is:

1. A method of forming semiconductor device comprising:

providing a semiconductor substrate having a planar surface;

preparing the surface by providing a surface layer of a material which is weakly bonded to the surface for controlling adhesion to the surface of overlying layers;

providing thereon a multilayer masking stack comprising a first masking layer of a material which may be etched selectively relatively to the substrate, and a second layer which has differential etch selectivity relative to the first masking layer;

patterning and etching the multilayer masking stack to define an opening for formation of a device structure on the substrate surface, the differential etch selectivity of the first and second masking layers providing for controlled undercutting of first masking layer relative to the second masking layer, to provide a device opening with undercut sidewalls, and exposing the underlying substrate within the opening;

depositing overall at least one layer of conductive material to form a contact with the substrate within the device opening, said at least one layer of conductive material thereby being deposited on the substrate surface within the device opening and over the surface of the multilayer masking stack, and the undercut sidewalls of the device opening causing a discontinuity in the at least one layer of conductive material, near the sidewall;

etching the at least one layer of conductive material, whereby etching occurs preferentially at the discontinuity near the sidewall and separates part of the at least one layer of conductive material to form a device structure on the substrate surface, thereby separating said part from surrounding parts of the at least one layer of conductive material and the underlying masking layers;

and then, removing the masking layer stack with the overlying conductive material by a lift-off process in which said layers are separated from the substrate at the weakly bonded surface layer, said weakly bonded surface layer facilitating separation of the masking stack from the substrate, leaving said device structure on the substrate surface.

2. A method according to claim 1 wherein deposition at an elevated temperature comprises sputtering.

3. A method according to claim 1 wherein the semiconductor substrate is a compound semiconductor and the step of preparing the surface comprises oxidizing the semiconductor surface to form a weakly bonded surface oxide.

4. A method according to claim 1 wherein the method comprises a subsequent step of chemically cleaning the substrate surface to remove traces of the weakly bonded surface layer to leave the device structure defined on the substrate surface and extending from the substrate surface.

5. A method according to claim 1 wherein the substrate comprises GaAs, and the weakly bonded surface layer comprises arsenic oxide.

6. A method according to claim 1 wherein the first masking layer comprises silicon dioxide and the second masking layer comprises silicon.

7. A method according to claim 1 wherein the first masking layer is selected from the group consisting titanium, silicon dioxide and silicon nitride; and the second masking layer is selected from the group consisting of aluminum and silicon.

8. A method according to claim 1 wherein the first and second masking layer are selected from the group consisting of aluminum on titanium; aluminum on silicon dioxide; and aluminum on silicon nitride.

9. A method of forming a self-aligned-gate structure of a FET, comprising providing a semiconductor substrate having a planar surface;

preparing the substrate by providing a surface layer of a material which is weakly bonded to the substrate for controlling adhesion to the surface of overlying layers;

providing thereon a multilayer masking stack comprising a first masking layer of a material which may be etched selectively relatively to the substrate, and a second layer which has differential etch selectivity relative to the to the first masking layer;

patterning and etching the multilayer masking stack to define opening for a gate structure on the substrate surface, the differential etch selectivity of the first and second masking layers providing for controlled undercutting of first layer relative to the second layer to provide a gate opening with undercut sidewalls and exposing the underlying substrate within the gate opening;

depositing overall at least one layer of a conductive material to form a contact with the substrate within the gate opening, the at least one layer of conductive material thereby being deposited on the substrate surface within the gate opening and over the surface of the multilayer masking stack, the undercut sidewalls of the gate opening causing a discontinuity in the deposited metal layers near the sidewall;

etching the at least one conductive layer, whereby etching occurs preferentially at the discontinuity, separating part of the conductive layers forming a gate structure within the gate opening from surrounding parts of the at least one conductive layer and the underlying masking layers;

and then, removing the composite masking layer with the overlying conductive layers by a lift-off process, in which said layers are separated from the substrate at the weakly bonded surface layer said weakly bonded surface layer controlling adhesion of the overlying layers and thereby facilitating separation of the masking stack from the substrate, leaving the gate structure on the substrate surface.

10. A method according to claim 9 wherein the step of depositing overall at least one layer of a conductive material within the gate opening comprises deposition of a conductive layer selected from the group of refractory metals and refractory metal silicides.

11. A method according to claim 10 wherein the conductive layer is provided by sputter deposition.

12. A method according to claim 10 wherein the conductive layer is provided by chemical vapour deposition.

13. A method according to claim 10 wherein the deposition temperature is $\geq 300°$ C.

14. A method according to claim 9 wherein the semiconductor substrate comprises a compound semiconductor and the step of preparing the surface comprises oxidizing the surface of the substrate to form a weakly bonded oxide layer thereon.

15. A method according to claim 9 wherein the method comprises a further subsequent step comprising chemically cleaning the substrate surface to remove any traces of the weakly bonded surface layer.

16. A method according to claim 9 wherein the first masking layer is provided by a layer of silicon dioxide, and the second masking layer is provided by a layer of silicon.

17. A method according to claim 9 wherein the first masking layer is provided by one of silicon dioxide and silicon nitride, and the second masking layer is provided by a layer of a metal consisting of one of aluminum and titanium.

18. A method according to claim 9 wherein the lift off-step comprises:

applying an adhesive film overall for peeling off the masking layer with the overlying conductive material from the substrate.

19. A method according to claim 9 wherein the lift-off step comprises immersing the sample in a chemical etch to remove the weakly bonded surface layer, thereby undercutting the masking layers and causing separation of the excess layers of conductive material and masking layers.

20. A method according to claim 9 wherein resulting gate structure has tapered sidewalls, and wherein the angle of the taper of the sidewalls is dependent on the relative thickness of the masking layer stack and the deposited layers of the at least one conductive layer, whereby a particular sidewall angle is provided by controlling the relative thicknesses of the said layers.

21. A method according to claim 9 wherein deposition of at least one layer of a conductive material comprises sputter depositing of a first layer of a refractory metal silicide and then sputter deposition of a second layer of a refractory metal.

22. A method according to claim 9 wherein the at least one conductive layer comprises a layer of tungsten and a layer of tungsten silicide.

* * * * *